United States Patent
Moser et al.

(10) Patent No.: US 8,693,205 B2
(45) Date of Patent: Apr. 8, 2014

(54) CONTROL UNIT FOR PERSONAL PROTECTION DEVICE FOR A VEHICLE AND METHOD FOR ASSEMBLING SUCH A CONTROL UNIT

(75) Inventors: Manfred Moser, Reutlingen (DE); Mark Wonner, Mundelsheim (DE); Roland Cupal, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 357 days.

(21) Appl. No.: 13/002,367

(22) PCT Filed: May 4, 2009

(86) PCT No.: PCT/EP2009/055361
§ 371 (c)(1),
(2), (4) Date: Mar. 24, 2011

(87) PCT Pub. No.: WO2010/000524
PCT Pub. Date: Jan. 7, 2010

(65) Prior Publication Data
US 2011/0182043 A1 Jul. 28, 2011

(30) Foreign Application Priority Data
Jul. 3, 2008 (DE) .......................... 10 2008 040 157

(51) Int. Cl.
*H05K 5/00* (2006.01)
(52) U.S. Cl.
USPC ........................... 361/752; 361/809; 361/810
(58) Field of Classification Search
USPC ......... 361/728–730, 799, 816, 818, 752, 796, 361/800, 807, 809, 810, 759; 312/223.1, 312/223.2
See application file for complete search history.

(56) References Cited

U.S. PATENT DOCUMENTS

| | | | | |
|---|---|---|---|---|
| 4,703,397 A * | 10/1987 | Minoura et al. | ............... | 361/826 |
| 5,243,131 A * | 9/1993 | Jakob et al. | ................... | 174/536 |
| 5,872,333 A * | 2/1999 | Uezono et al. | .................. | 174/55 |
| 5,982,624 A * | 11/1999 | Onoda et al. | .................. | 361/737 |
| 6,059,382 A * | 5/2000 | Schoettl | ..................... | 303/119.3 |
| 6,213,495 B1 | 4/2001 | Plankl et al. | | |
| 2002/0024800 A1 | 2/2002 | Skofljanec | | |
| 2003/0161110 A1* | 8/2003 | Spasevski et al. | ............ | 361/715 |
| 2012/0063104 A1* | 3/2012 | Moser et al. | .................. | 361/757 |

FOREIGN PATENT DOCUMENTS

| | | |
|---|---|---|
| DE | 200 12 623 | 11/2000 |
| DE | 101 07 949 | 9/2002 |
| EP | 0 650 228 | 4/1995 |
| EP | 0 927 508 | 7/1999 |
| EP | 1 034 983 | 9/2000 |
| EP | 1 282 345 | 2/2003 |
| GB | 2 167 241 | 5/1986 |

OTHER PUBLICATIONS

International Search Report, PCT/EP2009/055361 dated Sep. 1, 2009.

* cited by examiner

*Primary Examiner* — Hung S Bui
(74) *Attorney, Agent, or Firm* — Kenyon & Kenyon LLP

(57) ABSTRACT

A control unit is provided and a method for assembling such a control unit for a personal protection device for a vehicle. A circuit board is installed between a plastic cover and a plastic floor. An interface is positioned on the circuit board, for an electrical connection to at least one additional vehicle component. At least one opening is provided in the plastic cover for the electrical connection.

10 Claims, 4 Drawing Sheets

CONTROL UNIT FOR PERSONAL PROTECTION DEVICE FOR A VEHICLE AND METHOD FOR ASSEMBLING SUCH A CONTROL UNIT

FIELD OF THE INVENTION

The present invention relates to a control unit for a personal protection device for a vehicle and a method for assembling such a control unit.

BACKGROUND INFORMATION

An air bag control unit is described in European Published Patent Application No. 0 927 508, in which a male pin connector is mounted in such a way that a plug is plugged into the control unit parallel to a circuit board surface.

SUMMARY

By contrast, the control unit according to example embodiments of the present invention and the method according to example embodiments of the present invention of assembling such a control unit, for a personal protection device for a vehicle having the features described herein, have the advantage that it is able to be produced more simply and cost-effectively. For, a plastic floor is advantageously used to enclose the circuit board. The interface is advantageously applied on the circuit board. This interface is then ready for an electrical connection to a counterplug, via an opening in the plastic cover. That is, electrical signals are able to be brought via the interface to the circuit board and to the corresponding electrical components, and vice versa.

The interface is able to be produced more simply than conventional arrangements, since a separate plastic element for the interface is omitted.

In the case at hand, a control unit for a personal protection device for a vehicle is an electrical unit that processes sensor signals and generates control signals, as a function of the latter, for the personal protection device. As sensor signals one might use, for example, acceleration signals, structure-borne noise signals, rotational motion signals, such as rotational rate signals, air pressure signals, for instance, for detecting a side impact, but also driving dynamics signals and other starter signals. The personal protection device, in this instance, may be air bags, for example, seat-belt tensioners or crash-active head rests. These are activated, in the case of triggering, i.e. activation, using an ignition current for pyrotechnical ignition elements or an activating current for electromagnetic actuators The circuit board is a typical circuit board onto which the electrical components are plugged or adhered or soldered. The so-called SMD (surface-mounted devices) technique, that is well known, leads to a particularly good implementation. Accordingly, the electrical components and connecting contacts between these components are present on the circuit board.

The plastic cover and the plastic floor are made of a plastic which improves the EMC (electromagnetic compatibility), in particular. In this context, the following materials may be used: PBT-GF30 and PA66 GF30, the glass fiber proportion being variable. If necessary, an admixture may be provided to improve electric shielding properties, that is, for an improved electromagnetic compatibility.

The plastic cover and the plastic floor are arranged so that they fit together and thereby accommodate the at least one circuit board. In the assembled state, the control unit is resistant to dripping water, provided the counterplug has been applied to the interface through the opening in the plastic cover. The assembled direction is perpendicular to the circuit board. The water resistance may still be improved by seals that enclose the counterplug in the assembled state. The seals are applied in the opening, in this context.

The at least one interface is a male pin connector, for example, for producing an electrical connection to at least one additional vehicle component, via a wiring harness, for example. The interface may also be a plug matrix panel, which is then preferably soldered on or adhered on the circuit board using SMD technique.

The opening in the plastic cover has a rectangular or other shape, so as to enclose the counterplug as tightly as possible.

It is advantageous that the at least one interface makes possible the electrical connection in the assembly direction. This assembly direction is perpendicular to the circuit board, i.e. the assembly direction pierces the circuit board as a plane. This being the case, the interface may be arranged more simply, since not one electrical connection takes place via a plug in the plane of the circuit board, as is conventional. This, in particular, makes possible the more favorable production of the control unit.

It is further advantageous that the plastic cover is arranged so that a plug, that is inserted into the at least one interface, closes flush with the plastic cover. This flush termination makes possible the improved installation of the control unit in the vehicle, and enables effective protection from water. Flush termination, in this context, means that the surface of the plastic cover is in the same plane as the upper side of the plug that is introduced into the interface. For, a wiring harness is connected to the control unit via the plug. In general parlance, the interface is also known as a customer interface. The ignition is activated via this interface, for example. Data from sensors are read in and also data from other control units, such as a driving dynamics regulating control unit.

A step may preferably be provided in the plastic cover for this flush termination, the step being constructed in the area of the male pin connector. Because of this step, the counterplug and the housing cover terminate flush with each other, so that by applying a so-called shower label, no water is able to penetrate via the opening into the control unit housing, that is formed by the plastic cover and the plastic floor.

The shower label may be implemented using a prefabricated adhesive film, the adhesive film assuming the outer contour of the housing in a suitable shape, and dripping water not being able to penetrate either in the area of the plug connection or the items that are screwed on.

Because of this measure, a water protection class of at least IP52 is attained. The danger of the penetration of dripping water into the control unit is avoided thereby.

As was indicated above, in an advantageous manner, the implementation of the interface as at least one male pin connector is of advantage, the plastic cover being arranged so that the at least one opening and the at least one male pin connector are positioned for an electrical connection. This may be achieved, for example, in that the plastic cover has a kind of funnel. The fixing of this male pin connector, for instance in SMD development, takes place via this type of funnel in the housing cover, which brings the circuit board, inclusive of plugs, into the right position. The plugging of the counterplug to the interface in the plastic cover takes place perpendicularly and not horizontally, in contrast to conventional arrangements.

The male pin connector advantageously has at least two plastic pins for intercepting forces. These plastic pins are introduced into the circuit board, for instance, and also lead to the fastening of the male pin connector. The forces are particularly those forces that occur during the application of the counterplug into the interface in the housing. This leads to an increased reliability of the control unit described herein.

The counterplug is advantageously connected to the at least one interface by a plug contacting. As mentioned, this may occur more favorably by appropriate positioning.

The male pin connector may advantageously be fastened on the circuit board using a plug-through soldering technique, a THRS (through hole reflow soldering) or a press-fitting technique.

Exemplary embodiments of the present invention are illustrated in the drawings and are explained in greater detail in the following description.

DETAILED DESCRIPTION

Figure 1:
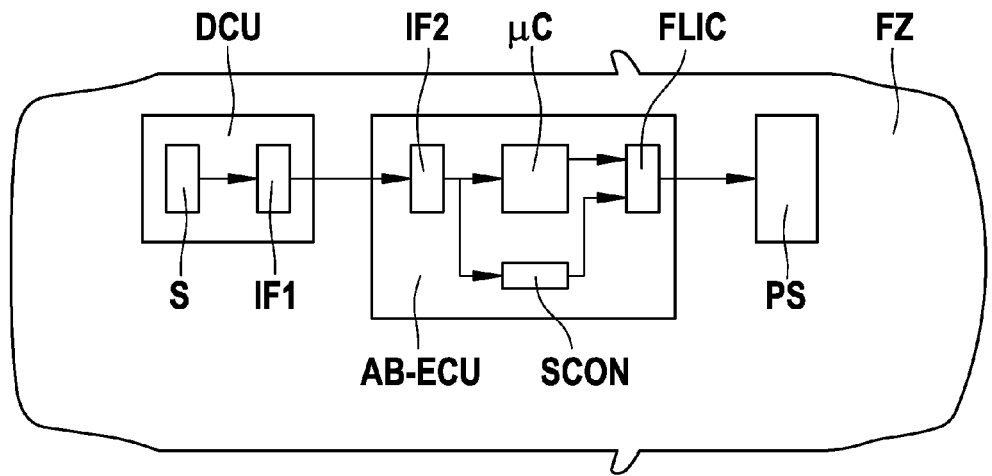
FIG. 1 is a block diagram of the control unit according to an example embodiment of the present invention having connected components in the vehicle.

FIG. 1 illustrates in a block diagram the control device according to an example embodiment of the present invention, having connected components, in a vehicle FZ. A sensor control unit DCU is connected to control unit AB-ECU, which has a sensor system S, for instance, a rotational rate sensor system and/or a rotational motion sensor system, which transmits its data via a first interface IF1 to air bag control unit AB-ECU. The interface may be a bus interface or a point-to-point connection. The data are received in air bag control unit AB-ECU by a second interface IF2, and transformed in a control unit of internal format, for instance, SPI (serial peripheral interface). In this context, the sensor data are supplied both to the evaluation circuit, namely, a microcontroller μC, and to a so-called safety controller SCON, so that there are two independent evaluation paths for the evaluation of the sensor data. Only when both evaluations yield that personal protection device PS, such as air bags, are to be actuated, does actuating circuit FLIC, which receives the evaluation results or the actuating signals of microcontroller μC and of safety controller SCON, actuate the personal protection device. In the process, for example, ignition elements have an ignition current applied to them.

This basic functional structure can be varied, for instance, by having sensors situated also in air bag control unit ABECU. Additional data may also be taken into account in the evaluation by other control units via a CAN transceiver. In the evaluation algorithms, the signal, for instance, an acceleration signal, is usually pragmatically integrated computationally, and compared to variable or fixed threshold values, for the purpose of reaching an activation decision. In the case of a variable threshold value, it is particularly advantageous to adapt the threshold value to the acceleration signal itself, for example. Safety controller SCON is usually arranged more simply as microcontroller μC. However, exactly such complex structures as safety controller are possible as a microcontroller. For this reason, the safety controller usually has threshold value evaluations which normally have fixed threshold values, and therefore these evaluations are not as accurate as those of a more complex software program.

Actuating circuit FLIC has appropriate evaluation electronics so as to be able to evaluate the actuating signals of microcontroller μC and of safety controller SCON. In the case at hand, only the components necessary to gain an understanding are shown. For the operation of control unit ABECU, additional components are required.

The air bag control unit is usually installed in the area of the vehicle tunnel. If it does not have any sensors, however, it may also be installed in other locations. In this context, one should only take care that, in the case of an accident, this air bag control unit at all events is destroyed in a late phase of the accident.

Figure 2:
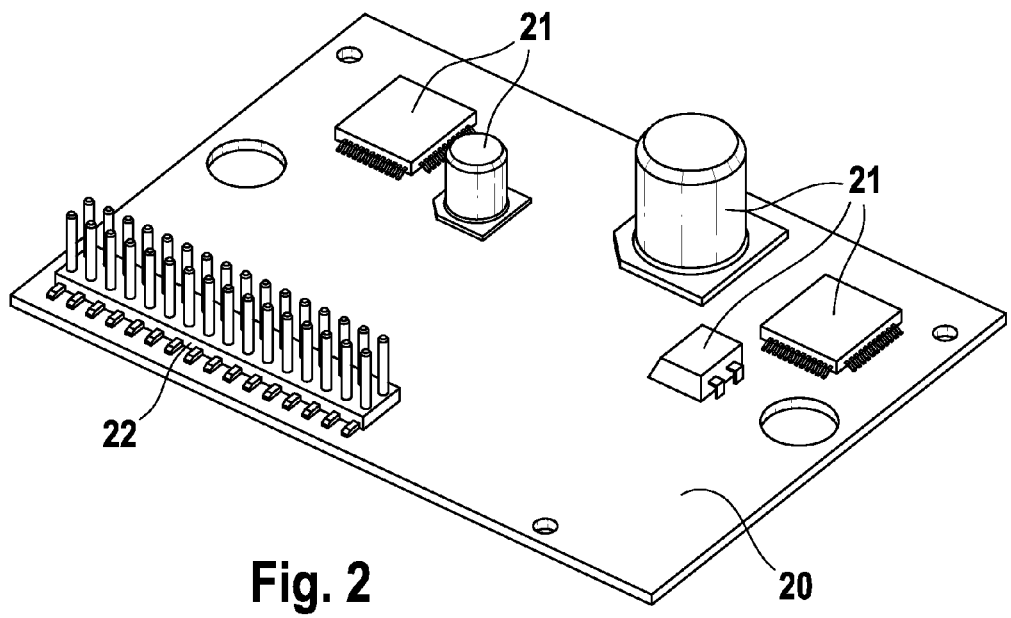
FIG. 2 is a schematic representation of the circuit board.

FIG. 2 shows a view of a circuit board 20, as may be used according to example embodiments of the present invention. Circuit board 20, which is particularly configured for SMD components, and therefore has bore holes only for fastening the circuit board or fixing it on the plastic floor or in connection with the plastic cover, accommodates various electrical components 21, and male pin connector 22, which produces the connection to the interface in the plastic cover. Components 21 and also male pin connector 22 are fixed on the circuit board by a so-called reflow process, for example, and firmly soldered thereby. In the case at hand, male pin connector 22 is provided in SMD technique. That is, it may be arranged in a space-saving manner, without a large plastic element.

The male pin connector may be provided using a plug-through soldering technique, THRS (through hole reflow soldering) or by a press-fitting technique.

Figure 3:
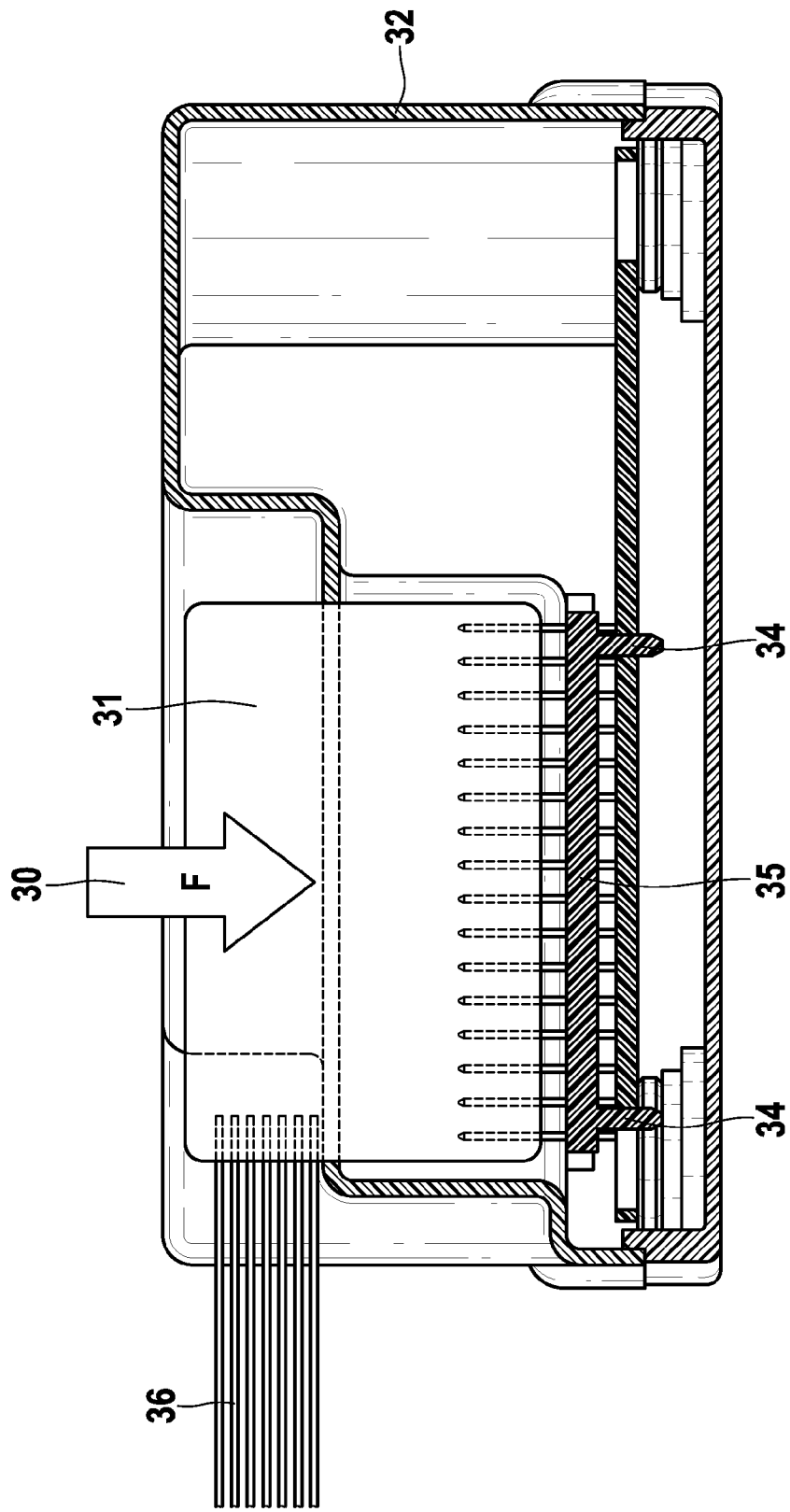
FIG. 3 is a side view of the control unit of an example embodiment of the present invention.

In a side view, FIG. 3 shows the control unit with its housing 32 and counterplug 31, which connects wiring harness 36 to the interface on the circuit board through the opening in the plastic cover. The plugging direction and the force direction are directed vertically onto the circuit board, as is shown in case 30. Male pin connector 22 as interface has plastic pins 34, which are provided for absorbing the forces of the counterplug. Just the possibility of being able to undertake the plugging direction not horizontally but, as in the present case, perpendicularly leads to considerable cost savings.

Figure 4:
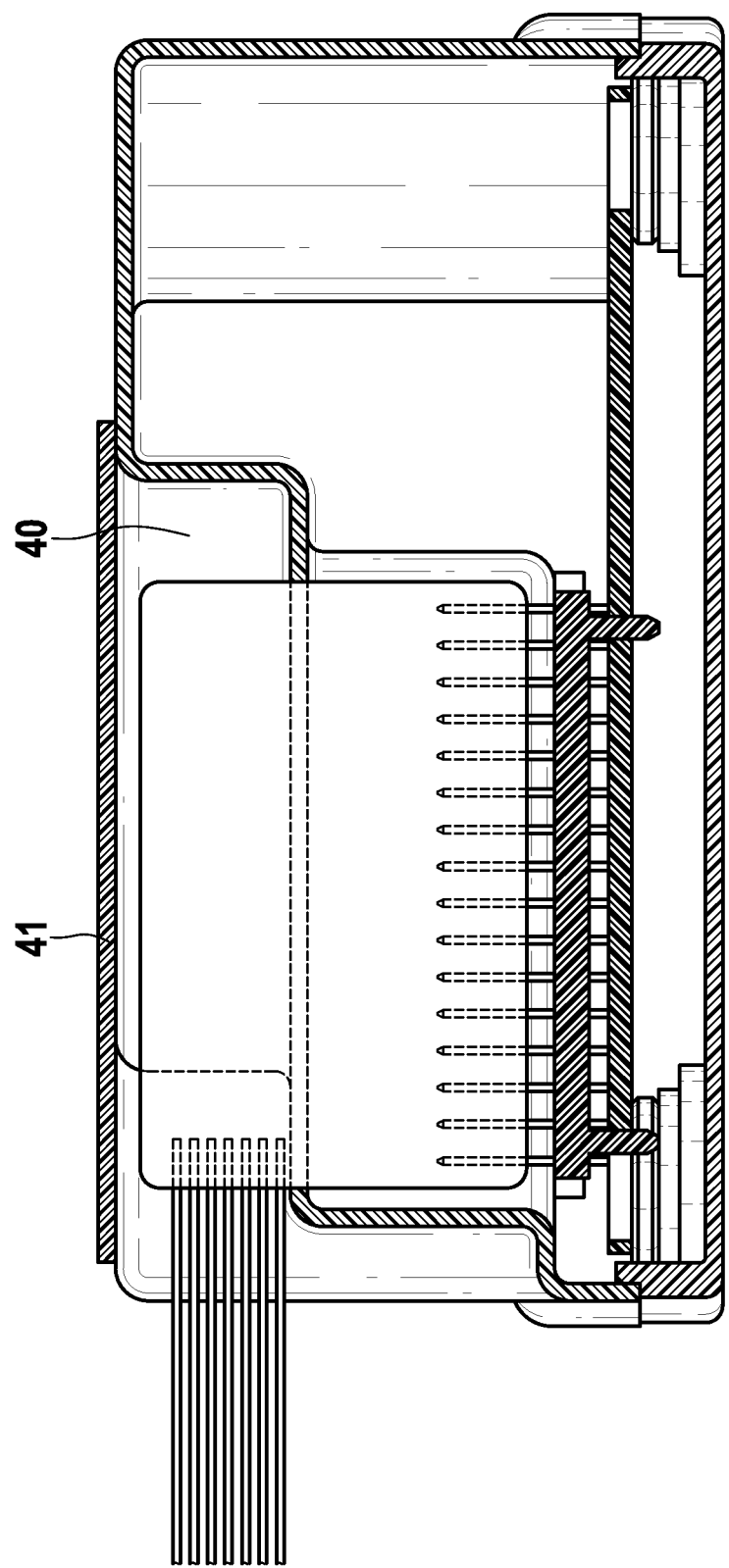
FIG. 4 is an additional side view of the control unit of an example embodiment of the present invention.

FIG. 4 shows another sectional side view of the control unit. Because of the integration of the male pin connector in the housing, that is, the interface is in the housing, and because of the perpendicular plugging of the counterplug, there is a risk that dripping water may penetrate into the control unit. In order to attain a water protection class IP52, the housing is constructed using a step in the area of the male pin connector. This step is closed off flush by the counterplug and the housing cover, so that, because of the penetration of a shower label, no water is able to penetrate into the housing via the opening. The shower label is designated by reference numeral 41, and the step in the housing cover is designated by reference numeral 40.

Figure 5:
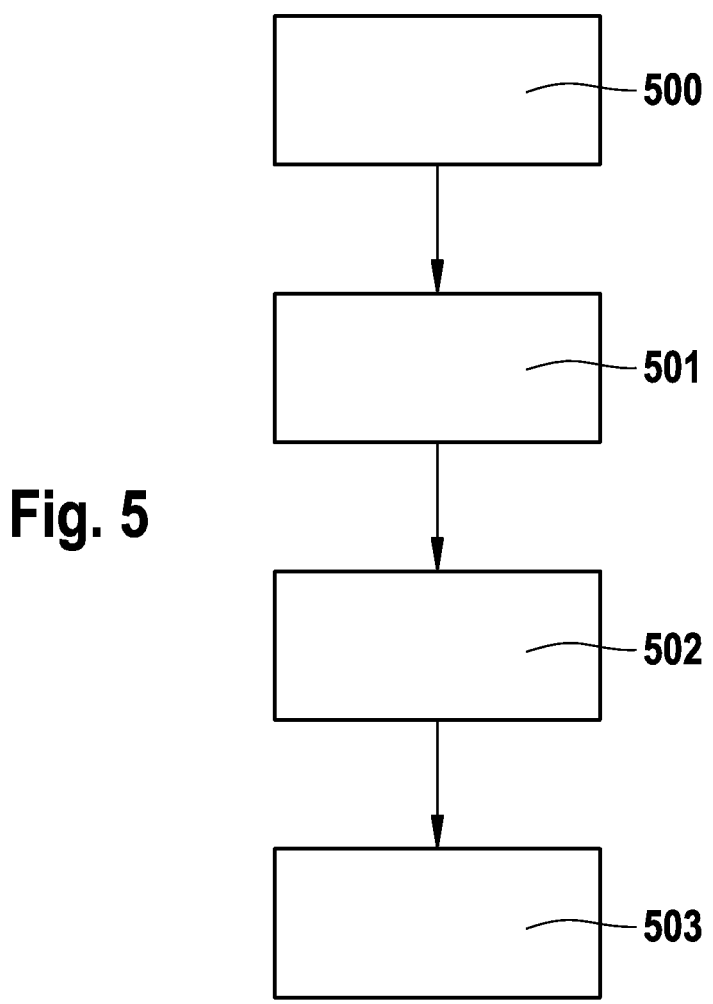
FIG. 5 is a flow chart of the method according to an example embodiment of the present invention.

FIG. 5 shows the sequence of the method according to an example embodiment of the present invention in a flowchart. In method step 500, electrical components are first situated on the circuit board, for instance, fastened on by soldering or by adhering.

In method step 501 the arrangement takes place of the interface and thus the male pin connector, also on the circuit board by soldering or adhering it on.

In method step 502, an opening through which the counterplug is plugged onto the male pin connector, is provided in the plastic cover. This may be already provided for the plastic cover in the injection-molding process or another production method.

In method step 503, the equipped circuit board is situated between the plastic cover and the plastic floor. The fastening succeeds for the time-being via force-locking or form-locking connecting.

What is claimed is:

1. A control unit for a personal protection device for a vehicle, comprising:
    at least one circuit board adapted to accommodate electrical components;
    a plastic cover and a plastic floor, between which the at least one circuit board is situated; and
    at least one interface for an electrical connection to at least one additional vehicle component;
    wherein:
        the at least one interface is provided on the at least one circuit board and is arranged as at least one male pin connector that includes at least one plastic pin for intercepting forces; and
        the plastic cover includes at least one opening and is arranged such that the at least one opening and the at least one male pin connector are relatively positioned for producing the electrical connection.

2. The control unit according to claim 1, wherein the at least one opening provides the electrical connection in an assembly direction.

3. The control unit according to claim 2, wherein the plastic cover is arranged so that a plug, that is inserted into the at least one opening, closes flush with the plastic cover.

4. The control unit according to claim 3, wherein the plastic cover has a step for the flush closing.

5. The control unit according to claim 2, wherein a protection from water is provided for the at least one opening.

6. The control unit according to claim 5, wherein the protection from water is a shower label, which is implemented using a prefabricated adhesive film.

7. The control unit according to claim 1, wherein the plastic cover is formed as a funnel.

8. The control unit according to claim 1, wherein the male pin connector is fastened by at least one of (a) plug-through soldering, (b) through hole reflow soldering, and (c) press-fitting.

9. A method for assembling a control device for a personal protection device for a vehicle, comprising:
    accommodating electrical components on at least one circuit board;
    positioning at least one interface for an electrical connection to at least one additional vehicle component on the at least one circuit board;
    providing at least one opening for the electrical connection in a plastic cover; and
    positioning the at least one circuit board between the plastic cover and a plastic floor;
    wherein:
        the at least one interface is arranged as at least one male pin connector that includes at least one plastic pin for intercepting forces; and
        the plastic cover is arranged such that the at least one opening and the at least one male pin connector are relatively positioned for producing the electrical connection.

10. The method according to claim 9, wherein the electrical connection is implemented using the at least one interface, by a plug contacting.

* * * * *

UNITED STATES PATENT AND TRADEMARK OFFICE
CERTIFICATE OF CORRECTION

PATENT NO.       : 8,693,205 B2
APPLICATION NO. : 13/002367
DATED            : April 8, 2014
INVENTOR(S)      : Moser et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 501 days.

Signed and Sealed this

Twenty-ninth Day of September, 2015

Michelle K. Lee
*Director of the United States Patent and Trademark Office*